(12) United States Patent
Chopra et al.

(10) Patent No.: US 6,997,781 B2
(45) Date of Patent: Feb. 14, 2006

(54) FIXED-ABRASIVE CHEMICAL-MECHANICAL PLANARIZATION OF TITANIUM NITRIDE

(75) Inventors: Dinesh Chopra, Boise, ID (US); Gundu Sabde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 361 days.

(21) Appl. No.: 10/116,585

(22) Filed: Apr. 4, 2002

(65) Prior Publication Data

US 2002/0106975 A1   Aug. 8, 2002

Related U.S. Application Data

(62) Division of application No. 09/339,735, filed on Jun. 24, 1999, now Pat. No. 6,419,554.

(51) Int. Cl.
*B24B 1/00* (2006.01)

(52) U.S. Cl. .............................. 451/41; 451/60; 29/847
(58) Field of Classification Search ............ 451/41, 451/60, 559, 7, 527; 29/831, 832, 847; 51/309; 438/690, 691, 745, 693; 106/3; 216/88, 89; 709/240; 714/763
See application file for complete search history.

(56) References Cited

U.S. PATENT DOCUMENTS

| | | |
|---|---|---|
| RE31,395 E | 9/1983 | Rooney |
| 4,522,928 A | 6/1985 | McVicker et al. |
| 4,954,142 A | 9/1990 | Carr et al. |
| 5,084,071 A | 1/1992 | Nenadic et al. |
| 5,232,875 A | 8/1993 | Tuttle et al. |
| 5,335,453 A | 8/1994 | Baldy et al. |
| 5,340,370 A | 8/1994 | Cadien et al. |
| 5,372,673 A | 12/1994 | Stager et al. |
| 5,476,413 A | 12/1995 | Hasegawa et al. |
| 5,516,346 A | 5/1996 | Cadien et al. |
| 5,603,654 A | 2/1997 | Hayashi |
| 5,624,303 A | 4/1997 | Robinson |
| 5,692,950 A | 12/1997 | Rutherford et al. |
| 5,725,417 A | 3/1998 | Robinson |
| 5,733,176 A | 3/1998 | Robinson et al. |
| 5,756,403 A * | 5/1998 | Tijburg et al. .............. 438/745 |
| 5,782,675 A | 7/1998 | Southwick |
| 5,783,489 A * | 7/1998 | Kaufman et al. ........... 438/692 |
| 5,810,964 A | 9/1998 | Shiraishi |
| 5,836,806 A | 11/1998 | Cadien et al. |
| 5,858,813 A | 1/1999 | Scherber et al. |
| 5,861,055 A | 1/1999 | Allman et al. |

(Continued)

OTHER PUBLICATIONS

Mallinckrodt Baker, Inc., "Ascorbic Acid", *MSDS Material Safety Data Sheet from Mallinckrodt Baker, Inc., MSDS No.: A7608*, http://www.jtbaker.com/msds/englishhtml/a7608.htm,(Effective Date: May 14, 2003).

*Primary Examiner*—George Nguyen
(74) *Attorney, Agent, or Firm*—Schwegman, Lunberg, Woessner & Kluth, P.A.

(57) ABSTRACT

Planarizing solutions, and their methods of use, for removing titanium nitride from the surface of a substrate using a fixed-abrasive planarizing pad. The planarizing solutions take the form of an etchant solution or an oxidizing solution. The etchant solutions are aqueous solutions containing an etchant and a buffer. The etchant contains one or more etching agents selective to titanium nitride. The oxidizing solutions are aqueous solutions containing an oxidizer and a buffer. The oxidizer contains one or more oxidizing agents selective to titanium nitride. In either solution, i.e., etchant or oxidizing solution, the buffer contains one or more buffering agents. Titanium nitride layers planarized in accordance with the invention may be utilized in the production of integrated circuits, and various apparatus utilizing such integrated circuits.

22 Claims, 7 Drawing Sheets

U.S. PATENT DOCUMENTS

| | | | |
|---|---|---|---|
| 5,863,838 A | | 1/1999 | Farkas et al. |
| 5,866,031 A | | 2/1999 | Carpio et al. |
| 5,869,392 A | | 2/1999 | Kimura |
| 5,954,997 A | * | 9/1999 | Kaufman et al. ........... 252/79.1 |
| 5,958,288 A | | 9/1999 | Mueller et al. |
| 5,972,792 A | * | 10/1999 | Hudson ...................... 438/691 |
| 5,993,685 A | | 11/1999 | Currie et al. |
| 6,001,269 A | * | 12/1999 | Sethuraman et al. .......... 216/89 |
| 6,080,709 A | | 6/2000 | Ishikawa et al. |
| 6,117,775 A | | 9/2000 | Kondo et al. |
| 6,136,711 A | | 10/2000 | Grumbine et al. |
| 6,159,083 A | | 12/2000 | Appel et al. |
| 6,194,317 B1 | | 2/2001 | Kaisaki et al. |
| 6,204,169 B1 | | 3/2001 | Bajaj et al. |
| 6,217,416 B1 | | 4/2001 | Kaufman et al. |
| 6,218,306 B1 | * | 4/2001 | Fishkin et al. .............. 438/692 |
| 6,235,071 B1 | * | 5/2001 | Tsuchiya et al. ............... 51/309 |
| 6,238,592 B1 | | 5/2001 | Hardy et al. |
| 6,346,144 B1 | * | 2/2002 | Lee ................................ 106/3 |
| 6,413,868 B1 | * | 7/2002 | Bartush et al. ............. 438/690 |
| 6,419,554 B1 | | 7/2002 | Chopra et al. |
| 6,432,828 B1 | * | 8/2002 | Kaufman et al. ........... 438/693 |
| 6,451,692 B1 | * | 9/2002 | Derderian et al. .......... 438/680 |
| 6,488,575 B1 | * | 12/2002 | Agarwal et al. ............ 451/527 |
| 6,584,509 B1 | * | 6/2003 | Putzolu ...................... 709/240 |
| 6,591,392 B1 | * | 7/2003 | Griffith et al. .............. 714/763 |
| 6,593,239 B1 | * | 7/2003 | Kaufman et al. ........... 438/692 |
| 6,620,037 B1 | * | 9/2003 | Kaufman et al. ........... 451/559 |
| 6,635,186 B1 | * | 10/2003 | Small et al. .................. 216/88 |
| 6,676,484 B1 | * | 1/2004 | Chopra ........................ 451/7 |
| 2004/0134873 A1 | | 7/2004 | Yao et al. |

\* cited by examiner

FIXED-ABRASIVE CHEMICAL-MECHANICAL PLANARIZATION OF TITANIUM NITRIDE

RELATED APPLICATIONS

This application is a Divisional of U.S. Ser. No. 09/339,735 filed Jun. 24, 1999, now U.S. Pat. No. 6,419,554, which is incorporated herein by reference.

TECHNICAL FIELD

The present invention relates generally to methods for planarizing semiconductor substrates, and in particular to planarizing solutions and methods of use for removing titanium nitride from the surface of semiconductor substrates using fixed-abrasive pads, and apparatus produced therefrom.

BACKGROUND

Chemical-Mechanical Planarizing (CMP) processes are often used for forming a flat surface on a semiconductor substrate in the manufacture of electronic devices. CMP processes generally remove material from a substrate surface to create a highly planar surface. A variety of planarizing machines have been developed to carry out such CMP processes.

Planarizing machines for use in CMP processing generally fall into two categories: web-format and fixed-pad format. In each case, a planarizing pad and a planarizing solution are combined to define a planarizing medium that mechanically and/or chemically-mechanically removes material from the surface of a substrate. The planarizing pad may be of a fixed-abrasive or non-abrasive type. With a fixed-abrasive pad type, abrasive particles are fixedly bonded to a suspension material. Furthermore, the planarizing solution used with a fixed-abrasive pad type is typically a "clean" solution, i.e., substantially devoid of abrasive particles as such abrasive particles are fixedly distributed across a planarizing surface of the planarizing pad. With a non-abrasive planarizing pad, no abrasive particles are associated with the pad, so the abrasive particles are introduced in the planarizing solution. Such planarizing solutions for use with non-abrasive pad types are often slurries of both abrasive particles as well as chemicals to aid removal of material from a substrate.

To planarize the substrate with the planarizing machine, the surface of the substrate is first contacted against the planarizing pad in the presence of the planarizing solution, i.e., a planarizing surface of the planarizing medium. While in contact, the substrate is then moved relative to the planarizing surface of the planarizing medium, generally through lateral, rotational, revolving or orbital movement of the substrate, the planarizing pad or both. Lateral movement is defined as movement in one direction. Rotational movement is defined as rotation about an axis located at the center point of the object in motion. Revolving movement is defined as rotation about some axis located at other than the center point of the object in motion. Orbital movement is defined as rotational or revolving movement combined with oscillation. Different types of movement may be combined, e.g., rotational movement of the substrate and rotational movement of the planarizing pad or revolving and rotational movement of the substrate against a stationary planarizing pad. As is well understood in the art, such relative movement is in a plane substantially parallel to the surface of substrate. As a result, the abrasive particles and/or the chemicals in the planarizing medium remove material from the surface of the substrate.

Fixed abrasive pad types are well known in the art of semiconductor wafer processing. See, e.g., U.S. Pat. No. 5,692,950 issued Dec. 2, 1997 to Rutherford et al.; U.S. Pat. No. 5,624,303 issued Apr. 29, 1997 to Robinson; and U.S. Pat. No. 5,335,453 issued Aug. 9, 1994 to Baldy et al. Despite widespread recognition and acceptance of fixed abrasive pads in the processing of semiconductor wafers, effective planarizing solutions for use in the fixed-abrasive planarization of an advantageous barrier material and conductor, i.e., titanium nitride (TiN), are lacking. As a result, the customary processing for planarizing titanium nitride utilizes abrasive slurries with non-abrasive pad types.

One problem with CMP processing is that the planarized surface of the wafer may not be sufficiently uniform across the whole surface of the wafer. In the competitive semiconductor industry, it is also desirable to maximize the throughput of finished wafers. The uniformity of the planarized surface and maximization of throughput is a function of the effectiveness and repeatability of the planarizing solution utilized with the planarizing pad, as well as a wide array of other CMP operating parameters. While a wide variety of planarizing solutions are available, these solutions are generally specific to the composition of the material to be removed as well as the type of planarizing pad used. For obvious reasons, planarizing solutions developed for non-abrasive pad types are ill suited for use with fixed-abrasive pad types. Therefore, it would be desirable to develop effective planarizing solutions for planarization of titanium nitride on the surface of a semiconductor wafer for use in conjunction with fixed-abrasive planarizing pads.

For the reasons stated above, and for other reasons stated below which will become apparent to those skilled in the art upon reading and understanding the present specification, there is a need in the art for methods of planarizing titanium nitride using fixed-abrasive planarizing pads.

SUMMARY

In one embodiment, the invention provides a method of planarizing titanium nitride on a surface of a substrate. The method includes contacting the surface of the substrate with a planarizing surface of a planarizing medium, the planarizing medium comprising a fixed-abrasive planarizing pad and a clean planarizing solution. The method further includes moving the surface of the substrate relative to the planarizing surface of the planarizing medium, thereby abrading the titanium nitride on the surface of the substrate. In another embodiment, moving the surface of the substrate relative to the planarizing surface of the planarizing medium comprises moving at least one of the substrate and the planarizing surface of the planarizing medium in a manner selected from the group consisting of lateral, rotational, revolving and orbital. In a further embodiment, the planarizing solution is an etchant solution. In a still further embodiment, the planarizing solution is an oxidizing solution.

In another embodiment, a method of planarizing titanium nitride on a surface of a substrate includes use of an etchant solution as the planarizing solution, wherein the etchant solution contains an etchant and a buffer in aqueous solution. In one embodiment, the etchant comprises at least one etching agent selected from the group consisting of oxalic acid, ascorbic acid and phosphoric acid. In a further embodiment, the buffer comprises at least one buffering agent selected from the group consisting of ammonium acetate, ammonium oxalate, ammonium phosphate and diammonium phosphate. In a still further embodiment, the etchant solution has a pH of approximately 1 to 5. In yet another embodiment, the etchant solution has a pH of approximately 1.5 to 3.

In a further embodiment, a method of planarizing titanium nitride on a surface of a substrate includes use of an oxidizing solution as the planarizing solution, wherein the oxidizing solution contains an oxidizer and a buffer in aqueous solution. In one embodiment, the oxidizer comprises at least one oxidizing agent selected from the group consisting of ammonium persulfate, ammonium heptamolybdate, ceric ammonium nitrate, ceric ammonium sulfate and hydrogen peroxide. In another embodiment, the buffer comprises at least one buffering agent selected from the group consisting of phosphoric acid, ammonium acetate, ammonium oxalate, ammonium phosphate and diammonium phosphate. In yet another embodiment, the oxidizing solution has a pH of approximately 1 to 6. In a further embodiment, the oxidizing solution has a pH of approximately 1.5 to 4.

In one embodiment, the invention provides a method of planarizing titanium nitride on a surface of a substrate. The method includes contacting the surface of the substrate with a planarizing surface of a planarizing medium, the planarizing medium comprising a fixed-abrasive planarizing pad and a clean planarizing solution, wherein the planarizing solution is an aqueous solution comprising approximately 1% to 5% by weight of oxalic acid and approximately 2% to 10% by weight of ammonium acetate. The method further includes moving the surface of the substrate relative to the planarizing surface of the planarizing medium, thereby abrading the titanium nitride on the surface of the substrate.

In another embodiment, the invention provides a clean aqueous planarizing solution. The clean aqueous planarizing solution includes an etchant having at least one etching agent selected from the group consisting of oxalic acid, ascorbic acid and phosphoric acid, and a buffer. In one embodiment, the buffer comprises at least one buffering agent selected from the group consisting of ammonium acetate, ammonium oxalate, ammonium phosphate and diammonium phosphate. In a further embodiment, the planarizing solution has a pH of approximately 1 to 5. In a still further embodiment, the planarizing solution has a pH of approximately 1.5 to 3. In another embodiment, the planarizing solution has approximately 1% to 10% by weight of the etchant and approximately 0% to 10% by weight of the buffer. In yet another embodiment, the planarizing solution has approximately 1% to 5% by weight of the etchant and approximately 0% to 10% by weight of the buffer. In another embodiment, the planarizing solution has approximately 1% to 5% by weight of oxalic acid and approximately 2% to 10% by weight of ammonium acetate.

In a further embodiment, the invention provides a clean aqueous planarizing solution. The clean aqueous planarizing solution includes an oxidizer having at least one oxidizing agent selected from the group consisting of ammonium persulfate, ammonium heptamolybdate, ceric ammonium nitrate, ceric ammonium sulfate and hydrogen peroxide, and a buffer. In one embodiment, the buffer comprises at least one buffering agent selected from the group consisting of phosphoric acid, ammonium acetate, ammonium oxalate, ammonium phosphate and diammonium phosphate. In another embodiment, the planarizing solution has a pH of approximately 1 to 6. In yet another embodiment, the planarizing solution has a pH of approximately 1.5 to 4. In a further embodiment, the planarizing solution has approximately 1% to 10% by weight of the oxidizer and approximately 0% to 10% by weight of the buffer. In a still further embodiment, the planarizing solution has approximately 1% to 5% by weight of the oxidizer and approximately 0.5% to 3% by weight of the buffer.

Further embodiments of the invention provide planarizing solutions and methods of removing titanium nitride of varying scope. Still further embodiments of the invention provide apparatus of varying scope produced in accordance with methods and planarizing solutions of the invention.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims.

Figure 1A:
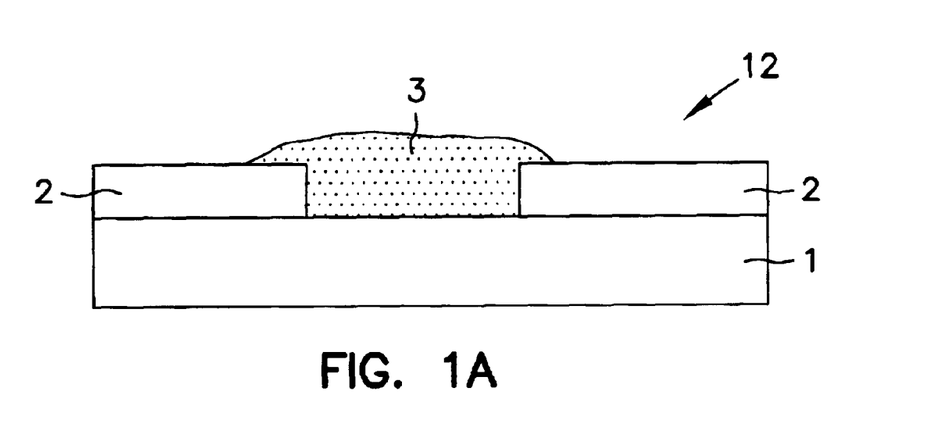
FIGS. 1A–1B are a cross-sectional views of a substrate with a titanium nitride layer at sequential processing stages in accordance with an embodiment of the invention.

FIG. 1A illustrates a typical substrate 12 having a first layer 1 and a patterned second layer 2. In typical semiconductor processing, first layer 1 may represent a wafer of single-crystal silicon or other base semiconductor layer, an insulating layer separating second patterned layer 2 from other layers, or a combination of multiple layers formed in prior processing steps. The composition and structure of first layer 1 and patterned second layer 2 are trivial.

Figure 1B:
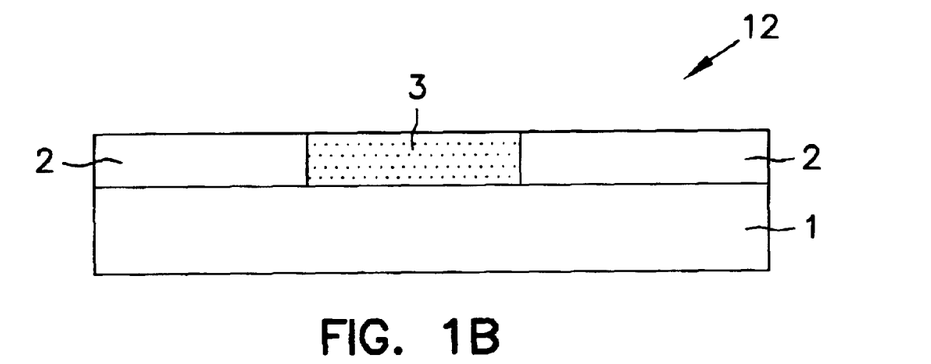

A titanium nitride layer 3 is formed on a portion of first layer 1 exposed by patterned second layer 2. Titanium nitride layer 3 may be formed by chemical vapor deposition (CVD) or other processes well known in the art. In FIG. 1B, a CMP process in accordance with an embodiment of the invention is used to remove a portion of titanium nitride layer 3 and to planarize the surface of substrate 12. Titanium nitride layer 3 may be utilized as a contact in an integrated circuit, e.g., where the portion of first layer 1 exposed by patterned second layer 1 forms an active area of a semiconductor device. The integrated circuit may be utilized in the formation of various electronic devices.

Figure 2A:
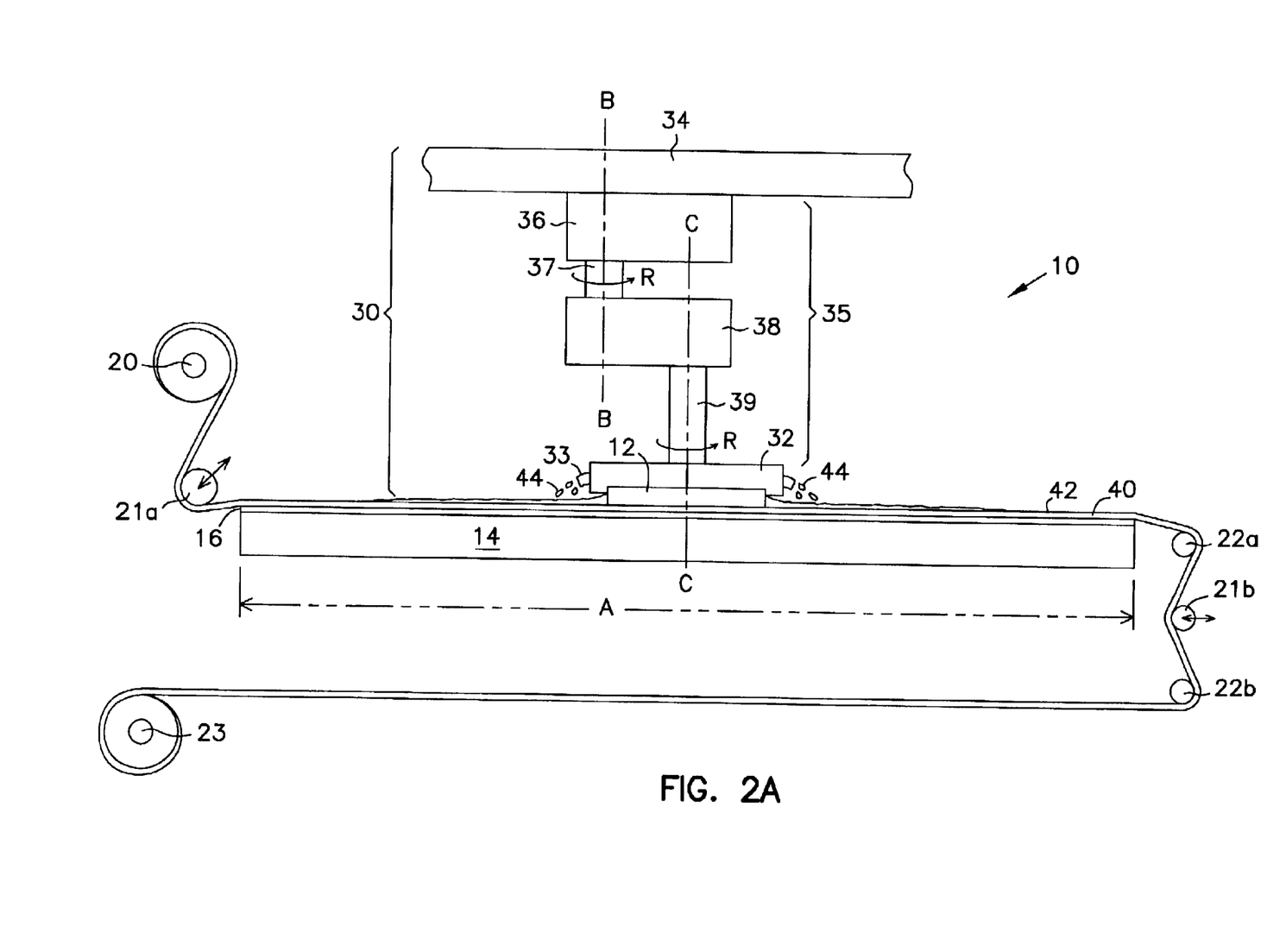
FIG. 2A is a schematic of a web-format planarizing machine as used in accordance with an embodiment of the invention.

FIG. 2A illustrates a web-format planarizing machine 10 for planarizing a substrate 12 in accordance with an embodiment of the invention. The substrate 12 has titanium nitride on its surface as illustrated in FIG. 1A. Planarizing machine 10 is used to remove at least a portion of the titanium nitride and to planarize the surface of substrate 12.

The planarizing machine 10 has a support table 14 with a top-panel 16 at a workstation where an operative portion (A) of a planarizing pad 40 is positioned. The top-panel 16 is generally a rigid plate to provide a flat, solid surface to which a particular section of the planarizing pad 40 may be secured during planarization.

The planarizing machine 10 also has a plurality of rollers to guide, position and hold the planarizing pad 40 over the top-panel 16. The rollers include a supply roller 20, first and second idler rollers 21a and 21b, first and second guide rollers 22a and 22b, and a take-up roller 23. The supply roller 20 carries an unused or pre-operative portion of the planarizing pad 40, and the take-up roller 23 carries a used or post-operative portion of the planarizing pad 40. Additionally, the first idler roller 21a and the first guide roller 22a stretch the planarizing pad 40 over the top-panel 16 to hold the planarizing pad 40 stationary during operation. A motor (not shown) drives at least one of the supply roller 20 and the take-up roller 23 to sequentially advance the planarizing pad 40 across the top-panel 16. As such, clean pre-operative sections of the planarizing pad 40 may be quickly substituted for used sections to provide a consistent surface for planarizing and/or cleaning the substrate 12.

The web-format planarizing machine 10 also has a carrier assembly 30 that controls and protects the substrate 12 during planarization. The carrier assembly 30 generally has a substrate holder 32 to pick up, hold and release the substrate 12 at appropriate stages of the planarizing cycle. A plurality of nozzles 33 attached to the substrate holder 32 dispense a planarizing solution 44 onto a planarizing surface 42 of the planarizing pad 40. The carrier assembly 30 also generally has a support gantry 34 carrying a drive assembly 35 that translates along the gantry 34. The drive assembly 35 generally has a actuator 36, a drive shaft 37 coupled to the actuator 36, and an arm 38 projecting from the drive shaft 37. The arm 38 carries the substrate holder 32 via another shaft 39 such that the drive assembly 35 revolves the substrate holder 32 about an axis B—B offset from a center point C—C of the substrate 12.

The planarizing pad 40 and the planarizing solution 44 define a planarizing medium, having the planarizing surface 42, that chemically-mechanically removes material from the surface of the substrate 12. The planarizing pad 40 is of a fixed-abrasive type.

In one embodiment, the planarizing solution 44 is an etchant solution and contains an etchant of at least one etching agent and a buffer of at least one buffering agent in aqueous solution. Etchant chemistries differ significantly from oxidizer chemistries commonly used in conventional abrasive slurries, i.e., those used with non-abrasive pad types. In etchant chemistries, the etchants are reducing agents which complex the titanium to facilitate removal. Preferred etching agents include oxalic acid ($HOOCCOOH.2H_2O$), ascorbic acid ($C_6H_8O_6$), and phosphoric acid ($H_3PO_4$). Preferred buffering agents include ammonium acetate ($NH_4(C_2H_3O_2)$), ammonium oxalate (($NH_4)_2C_2O_4.H_2O$), ammonium phosphate ($NH_4H_2PO_4$), and diammonium phosphate (($NH_4)_2HPO_4$).

The etchant solution has a pH of approximately 1 to 5, preferably less than approximately 3, and more preferably in the range of approximately 1.5 to 3. Etchant concentration in the etchant solution is preferably in the range of approximately 1% to 10% by weight and more preferably in the range of approximately 1% to 5% by weight.

Suitable buffer concentrations are expected to be in the range of approximately 0% to 10% by weight. Concentrations of etchant and buffer may fall outside the preferred ranges depending upon the combination of etching agents and buffering agents selected. However, it is within the skill in the art to determine appropriate concentrations without undue experimentation to achieve the desired pH ranges. The pH is defined by the equation $pH=\log_{10}[H+]^{-1}$, the logarithm of the reciprocal of the hydrogen-ion concentration of the solution.

In one embodiment, more than one etching agent is used as the etchant in the etchant solution. In another embodiment, the etchant in the etchant solution consists essentially of one etching agent. In one embodiment, more than one buffering agent is used as the buffer in the etchant solution. In another embodiment, the buffer in the etchant solution consists essentially of one buffering agent. In still another embodiment, planarizing solution 44 comprises an aqueous solution having approximately 1% to 5% by weight of oxalic acid, approximately 2% to 10% by weight of ammonium acetate, and a pH of approximately 1.5 to 3.

The etchant solution may contain additional chemical components that do not materially affect the basic and novel characteristic of the solutions disclosed herein. Some examples include dyes, lubricants, stabilizers, surfactants, thickening agents, preservatives and antimicrobial agents to name a few. Where more than one etching agent is utilized in the etchant solution, the weight % of the etchant is based on the combined weight of all such etching agents in relation to the total weight of the solution. Where more than one buffering agent is utilized in the etchant solution, the weight % of the buffer is based on the combined weight of all such buffering agents in relation to the total weight of the solution.

In a further embodiment, the planarizing solution 44 is an oxidizing solution and contains an oxidizer of at least one oxidizing agent and a buffer of at least one buffering agent in aqueous solution. Preferred oxidizing agents include ammonium persulfate (($NH_4)_2S_2O_8$), ammonium heptamolybdate (($NH_4)_6Mo_7O_{24}.4H_2O$), ceric ammonium nitrate ($Ce(NO_3)_4.2NH_4NO_3$), ceric ammonium sulfate ($Ce(SO_4)_2.2(NH_4)_2SO_4$), and hydrogen peroxide ($H_2O_2$). Preferred buffering agents include phosphoric acid ($H_3PO_4$), ammonium acetate ($NH_4(C_2H_3O_2)$), ammonium oxalate (($NH_4)_2C_2O_4.H_2O$), ammonium phosphate ($NH_4H_2PO_4$), and diammonium phosphate (($NH_4)_2HPO_4$).

The oxidizing solution has a pH of approximately 1 to 6, preferably less than approximately 4, and more preferably in the range of approximately 1.5 to 4. Oxidizer concentration in the oxidizing solution is preferably in the range of approximately 1% to 10% by weight and more preferably in the range of approximately 1% to 5% by weight. An oxidizer concentration of approximately 2% by weight is further preferred.

Suitable buffer concentrations are expected to be in the range of approximately 0% to 10% by weight. Such concentration of buffer is generally expected to be approximately 0.5% to 3% by weight at the preferred oxidizer concentrations. Concentrations of oxidizer and buffer may fall outside the preferred ranges depending upon the combination of oxidizing agents and buffering agents selected. However, it is within the skill in the art to determine appropriate concentrations without undue experimentation to achieve the desired pH ranges.

In one embodiment, more than one oxidizing agent is used as the oxidizer in the oxidizing solution. In another embodiment, the oxidizer in the oxidizing solution consists essentially of one oxidizing agent. In one embodiment, more than one buffering agent is used as the buffer in the oxidizing solution. In another embodiment, the buffer in the oxidizing solution consists essentially of one buffering agent.

The oxidizing solution may contain additional chemical components that do not materially affect the basic and novel characteristic of the solutions disclosed herein. Some examples include dyes, lubricants, stabilizers, surfactants, thickening agents, preservatives and antimicrobial agents to name a few. Where more than one oxidizing agent is utilized in the oxidizing solution, the weight % of the oxidizer is based on the combined weight of all such oxidizing agents in relation to the total weight of the solution. Where more than one buffering agent is utilized in the oxidizing solution, the weight % of the buffer is based on the combined weight of all such buffering agents in relation to the total weight of the solution.

To planarize the substrate 12 with the planarizing machine 10, the carrier assembly 30 presses the substrate 12 against the planarizing surface 42 of the planarizing pad 40 in the presence of the planarizing solution 44. The drive assembly 35 then moves the substrate holder 32 relative to the planarizing surface 42 to move the substrate 12 across the planarizing surface 42. Movement of the substrate holder 32 is in a plane substantially parallel to the surface of substrate 12. As the surface of the substrate 12 moves across the planarizing surface 42, material is continuously removed from the surface of the substrate 12 through abrasion.

Figure 2B:
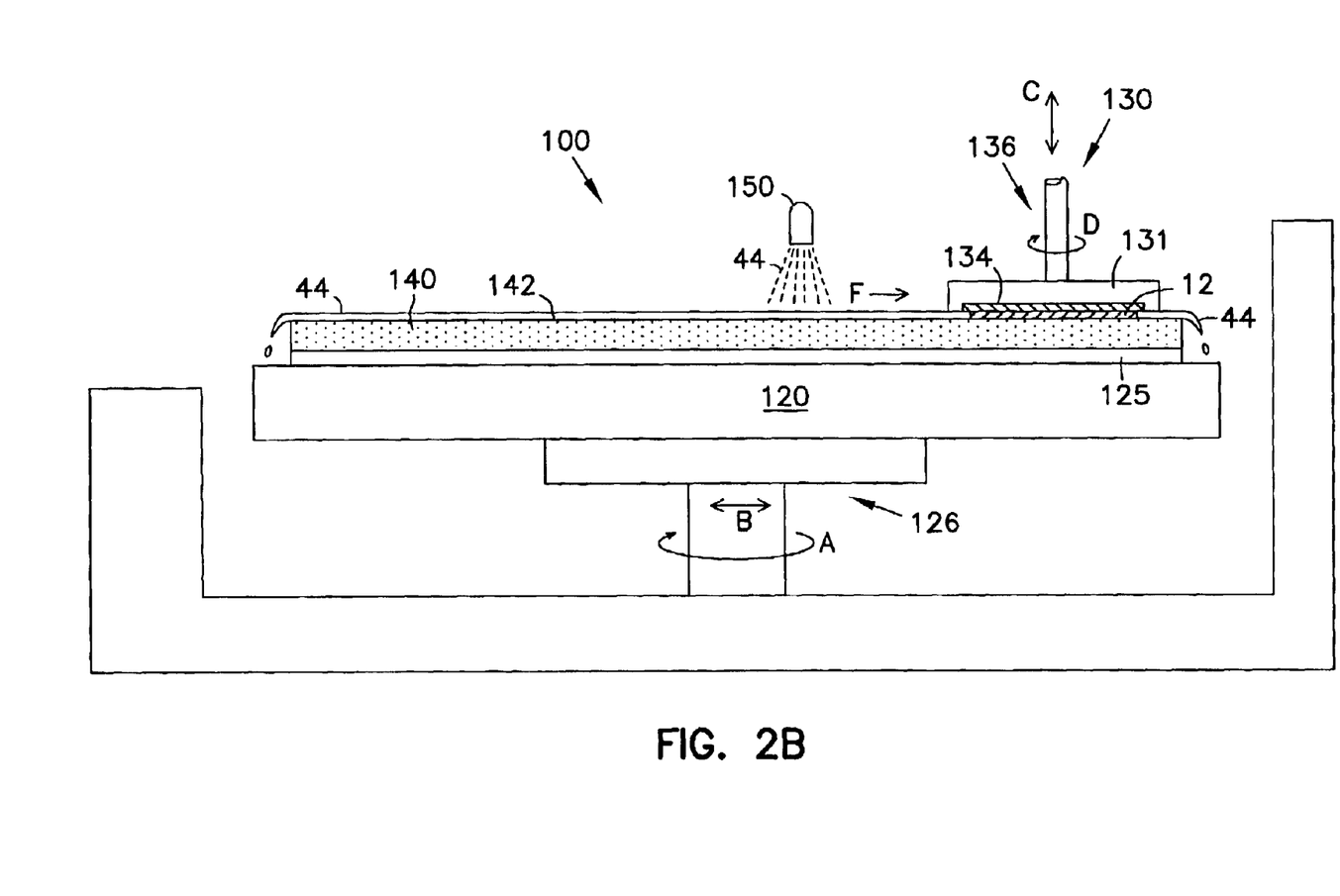
FIG. 2B is a schematic of a fixed-pad format planarizing machine as used in accordance with an embodiment of the invention.

Alternatively, the planarizing machine may utilize fixed pads instead of webs as the planarization pad. FIG. 2B illustrates a fixed-pad format planarizing machine 100 for use in accordance with an embodiment of the invention. The planarizing machine 100 has a platen 120, an underpad 125 attached to the platen 120, a polishing pad 140 attached to the underpad 125, and a carrier assembly 130 positioned over the polishing pad 140. A drive assembly 126 rotates the platen 120 (as indicated by arrow A), or it reciprocates the platen 120 back and forth (as indicated by arrow B). Other planarizing machines may revolve the platen 120 about a point. Since the polishing pad 140 is attached to the underpad 125, the polishing pad 140 moves with the platen 120.

The carrier assembly 130 has a substrate holder 131 and resilient pad 134 to which a substrate 12 may be attached. The carrier assembly 130 may be a weighted, free-floating substrate holder, or an actuator assembly 136 may be attached to the carrier assembly 130 to impart axial and/or rotational motion (as indicated by arrows C and D, respectively).

To planarize the substrate 12 with the planarizing machine 100, the carrier assembly 130 presses the substrate 12 surface-downward against the polishing pad 140. While the surface of the substrate 12 presses against the polishing pad 140, at least one of the platen 120, and therefore the planarizing surface 142, or the substrate holder 131 moves relative to the other to move the substrate 12 across the planarizing surface 142. Movement of the platen 120 and/or the substrate holder 131 are in planes substantially parallel to the surface of substrate 12. As the surface of the substrate 12 moves across the planarizing surface 142, material is continuously removed from the surface of the substrate 12 through abrasion.

The planarizing pad 140 and the planarizing solution 44 define a planarizing medium that chemically-mechanically removes material from the surface of the substrate 12. The planarizing pad 140 is of a fixed-abrasive type. The planarizing machine 100 has a planarizing solution dispenser 150 for application of the planarizing solution 44 to the planarizing surface 142 of the planarizing medium. Planarizing solution 44 may be an oxidizing solution or an etchant solution of the invention.

It is recognized that the planarizing machines described above are typical of the major formats, i.e., web format or fixed-pad format, but that other mechanical variations and adaptations are well known in the art. However, planarizing solutions of the invention are not dependent upon the planarizing machine format.

The various embodiments of the invention permit CMP removal of titanium nitride using fixed-abrasive planarizing pads, regardless of the format of the planarizing machine. In conjunction with the various embodiments of the invention, the CMP process may be a conditionless planarizing process, i.e., conditioning of the planarizing pad prior to use may be eliminated.

It will be apparent that semiconductor wafers processed in accordance with the invention may be utilized to produce a variety of integrated circuit devices. It is believed that integrated circuit devices produced in accordance with the invention exhibit less performance variability than devices produced using non-abrasive pad types with abrasive slurry planarizing solutions due to reduced process variability. The reduced process variability arises from the ability to eliminate conditioning of the planarizing pad prior to use as well as elimination of variability associated with the propensity of the abrasive particles in abrasive slurry planarizing solutions to settle or agglomerate during storage and use.

Consequently, integrated circuit devices produced in accordance with the invention are expected to exhibit physical characteristics different from the physical characteristics inherent in planarizing titanium nitride using non-abrasive planarizing pads in conjunction with abrasive slurry planarizing solutions due to more uniform abrasion of the titanium nitride on the surface of the substrate. In addition, reactive characteristics inherent in the planarizing solutions of the invention are expected to produce physical characteristics different from the physical characteristics produced by planarizing solutions of alternate chemistries, given the differing reactive characteristics inherent in such alternate chemistries. One typical integrated circuit device for use with the invention is a memory device.

Memory Devices

Figure 3:
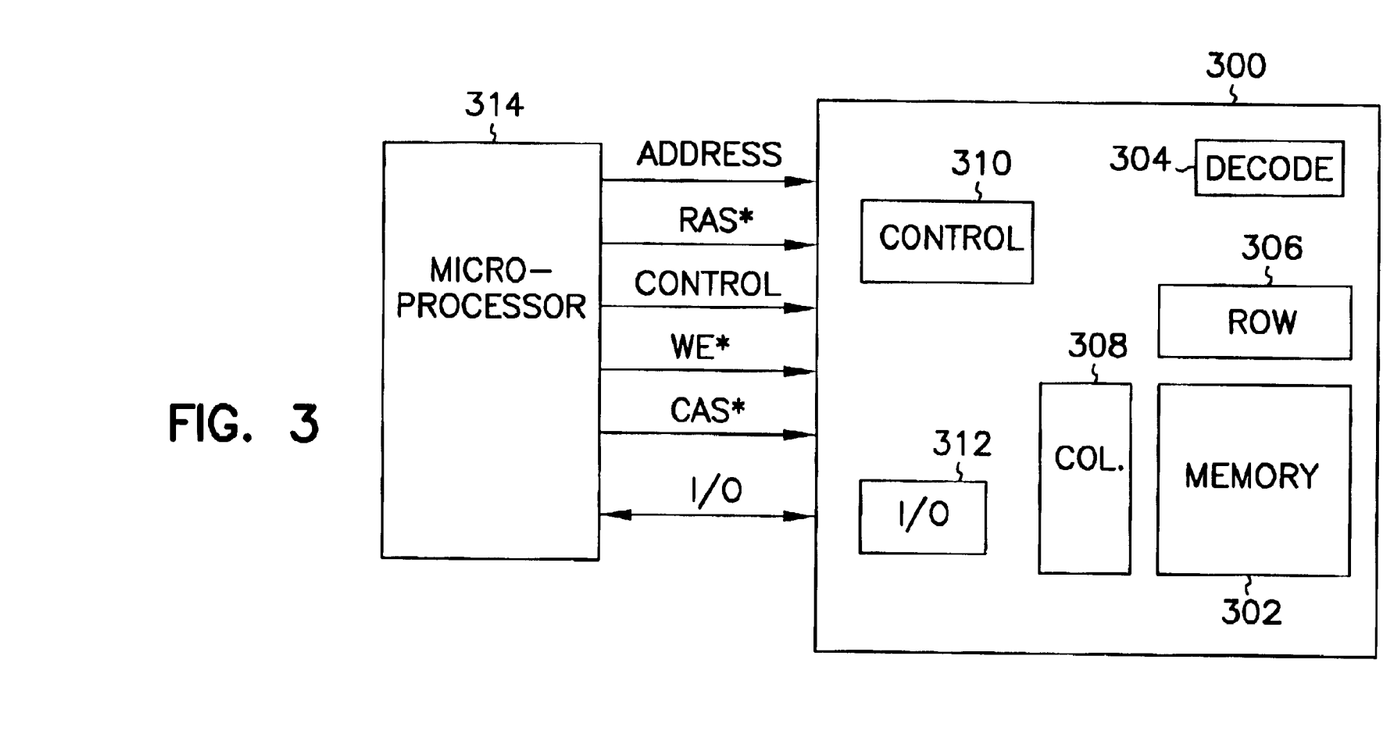
FIG. 3 is a block diagram of an integrated circuit memory device in accordance with an embodiment of the invention.

FIG. 3 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 3 has been simplified to help focus on the invention. The memory device 300 has at least one titanium nitride layer planarized in accordance with the invention.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 4:
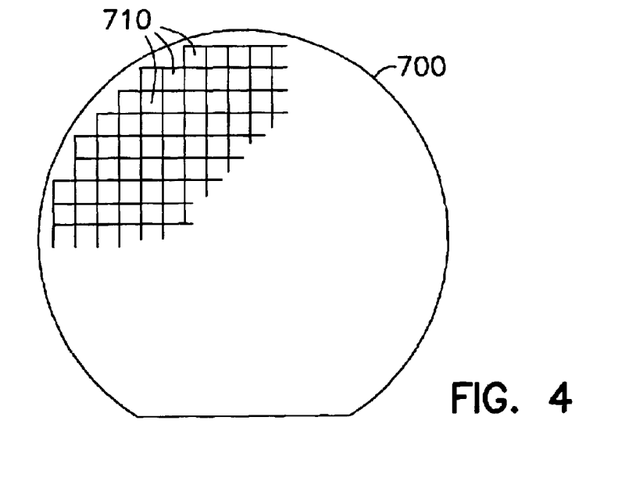
FIG. 4 is an elevation view of a wafer containing semiconductor dies in accordance with an embodiment of the invention.

With reference to FIG. 4, in one embodiment, a semiconductor die 710 is produced from a silicon wafer 700. A die is an individual pattern, typically rectangular, on a substrate that contains circuitry, or integrated circuit devices, to perform a specific function. Semiconductor die 710 has at least one titanium nitride layer planarized in accordance with the invention. A semiconductor wafer will typically contain a repeated pattern of such dies containing the same functionality. Die 710 may contain circuitry for the inventive memory device, as discussed above. Die 710 may further contain additional circuitry to extend to such complex devices as a monolithic processor with multiple functionality. Die 710 is typically packaged in a protective casing (not shown) with leads extending therefrom (not shown) providing access to the circuitry of the die for unilateral or bilateral communication and control.

Circuit Modules

Figure 5:
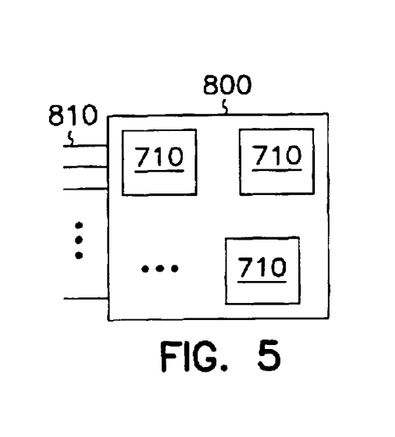
FIG. 5 is a block diagram of an exemplary circuit module in accordance with an embodiment of the invention.

As shown in FIG. 5, two or more dies 710 may be combined, with or without protective casing, into a circuit module 800 to enhance or extend the functionality of an individual die 710. Circuit module 800 may be a combination of dies 710 representing a variety of functions, or a combination of dies 710 containing the same functionality. Some examples of a circuit module include memory modules, device drivers, power modules, communication modems, processor modules and application-specific modules and may include multilayer, multichip modules. Circuit module 800 may be a subcomponent of a variety of electronic systems, such as a clock, a television, a cell phone, a personal computer, an automobile, an industrial control system, an aircraft and others. Circuit module 800 will have a variety of leads 810 extending therefrom and coupled to the dies 710 providing unilateral or bilateral communication and control.

Figure 6:
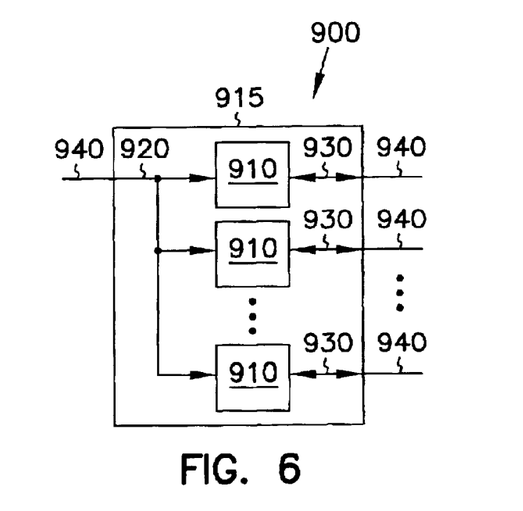
FIG. 6 is a block diagram of an exemplary memory module in accordance with an embodiment of the invention.

FIG. 6 shows one embodiment of a circuit module as memory module 900. Memory module 900 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 900 contains multiple memory devices 910 contained on support 915, the number depending upon the desired bus width and the desire for parity. Memory module 900 may contain memory devices 910 on both sides of support 915. Memory module 900 accepts a command signal from an external controller (not shown) on a command link 920 and provides for data input and data output on data links 930. The command link 920 and data links 930 are connected to leads 940 extending from the support 915. Leads 940 are shown for conceptual purposes and are not limited to the positions shown in FIG. 6.

Electronic Systems

Figure 7:
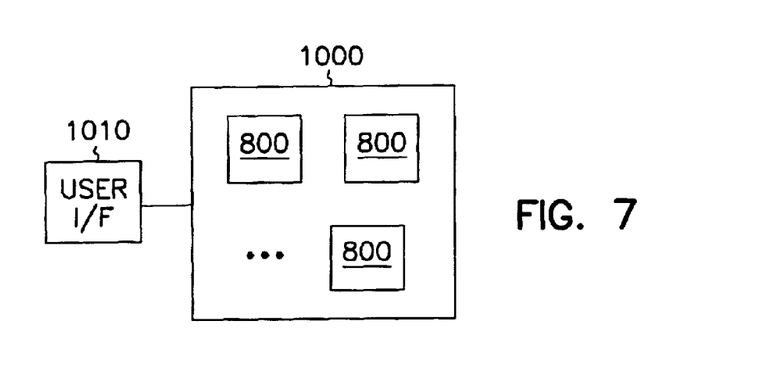
FIG. 7 is a block diagram of an exemplary electronic system in accordance with an embodiment of the invention.

FIG. 7 shows an electronic system 1000 containing one or more circuit modules 800. Electronic system 1000 generally contains a user interface 1010. User interface 1010 provides a user of the electronic system 1000 with some form of control or observation of the results of the electronic system 1000. Some examples of user interface 1010 include the keyboard, pointing device, monitor and printer of a personal computer; the tuning dial, display and speakers of a radio; the ignition switch and gas pedal of an automobile; and the card reader, keypad, display and currency dispenser of an automated teller machine. User interface 1010 may further describe access ports provided to electronic system 1000. Access ports are used to connect an electronic system to the more tangible user interface components previously exemplified. One or more of the circuit modules 800 may be a processor providing some form of manipulation, control or direction of inputs from or outputs to user interface 1010, or of other information either preprogrammed into, or otherwise provided to, electronic system 1000. As will be apparent from the lists of examples previously given, electronic system 1000 will often contain certain mechanical components (not shown) in addition to circuit modules 800 and user interface 1010. It will be appreciated that the one or more circuit modules 800 in electronic system 1000 can be replaced by a single integrated circuit. Furthermore, electronic system 1000 may be a subcomponent of a larger electronic system.

Figure 8:
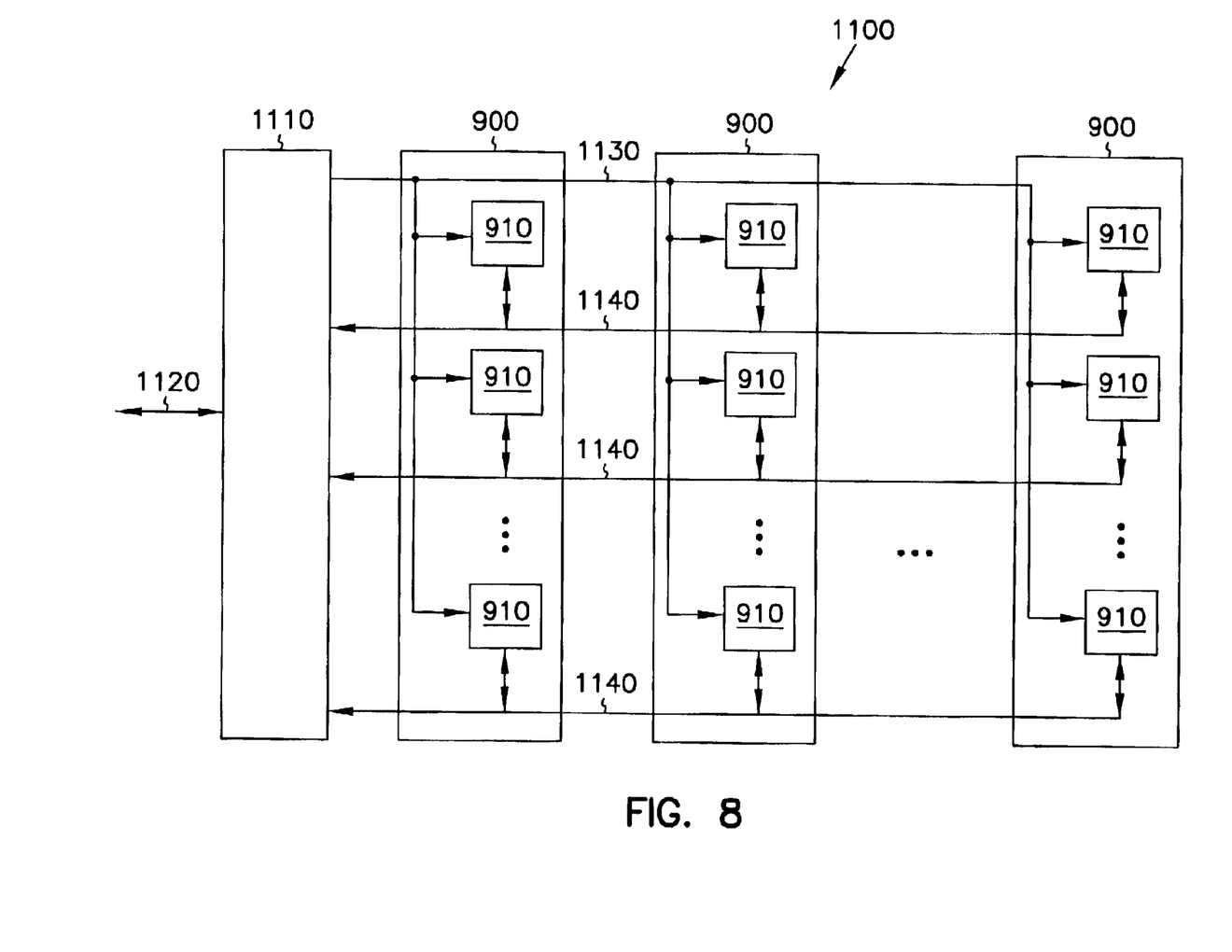
FIG. 8 is a block diagram of an exemplary memory system in accordance with an embodiment of the invention.

FIG. 8 shows one embodiment of an electronic system as memory system 1100. Memory system 1100 contains one or more memory modules 900 and a memory controller 1110. Memory controller 1110 provides and controls a bidirectional interface between memory system 1100 and an external system bus 1120. Memory system 1100 accepts a command signal from the external bus 1120 and relays it to the one or more memory modules 900 on a command link 1130. Memory system 1100 provides for data input and data output between the one or more memory modules 900 and external system bus 1120 on data links 1140.

Figure 9:
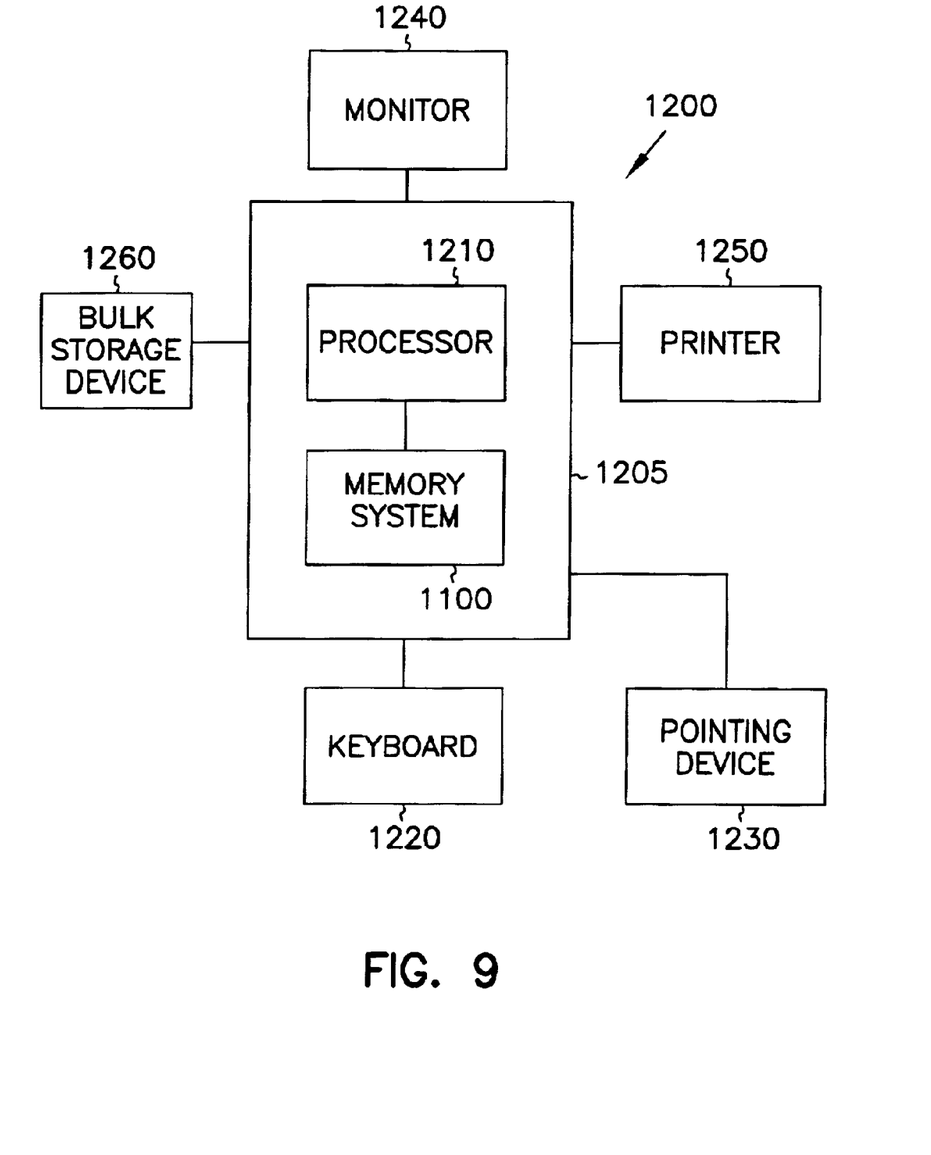
FIG. 9 is a block diagram of an exemplary computer system in accordance with an embodiment of the invention.

FIG. 9 shows a further embodiment of an electronic system as a computer system 1200. Computer system 1200 contains a processor 1210 and a memory system 1100 housed in a computer unit 1205. Computer system 1200 is but one example of an electronic system containing another electronic system, i.e., memory system 1100, as a subcomponent. Computer system 1200 optionally contains user interface components. Depicted in FIG. 9 are a keyboard 1220, a pointing device 1230, a monitor 1240, a printer 1250 and a bulk storage device 1260. It will be appreciated that other components are often associated with computer system 1200 such as modems, device driver cards, additional storage devices, etc. It will further be appreciated that the processor 1210 and memory system 1100 of computer system 1200 can be incorporated on a single integrated circuit. Such single package processing units reduce the communication time between the processor and the memory circuit.

Conclusion

Planarizing solutions, and their methods of use, for removing titanium nitride from the surface of a substrate using a fixed-abrasive planarizing pad type are disclosed. The planarizing solutions may take the form of an etchant solution or an oxidizing solution. The etchant solutions are aqueous solutions containing an etchant and a buffer. The etchant contains one or more etching agents selective to titanium nitride. The oxidizing solutions are aqueous solutions containing an oxidizer and a buffer. The oxidizer contains one or more oxidizing agents selective to titanium nitride. In either solution, i.e., etchant or oxidizing solution, the buffer contains one or more buffering agents. Titanium nitride layers planarized in accordance with the invention may be utilized in the production of integrated circuits, and various apparatus utilizing such integrated circuits.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, other planarizing machine formats may be utilized with the invention. Furthermore, titanium nitride layers planarized in accordance with the invention may be utilized as conductor lines, barrier layers or other structures in addition to the contacts described herein. Accordingly, this application is intended to cover any adaptations or variations of the invention. It is manifestly intended that this invention be limited only by the following claims and equivalents thereof.

What is claimed is:

1. A method of forming an electronic system, comprising:
    providing a processor; and
    coupling a circuit module having a plurality of leads to the processor, the circuit module further having a semiconductor die coupled to at least a portion of the plurality of leads, the semiconductor die including an integrated circuit having a titanium nitride layer, the titanium nitride layer planarized by a method comprising:
        abrading the titanium nitride layer with a planarizing surface of a planarizing medium including a fixed-abrasive planarizing pad and a clean planarizing solution, the planarizing solution having an etchant and a buffer, the etchant including at least one etching agent selected from the group consisting of oxalic acid, ascorbic acid and phosphoric acid.

2. The method of claim 1, wherein abrading the titanium nitride layer with a planarizing surface of a planarizing medium including a fixed-abrasive planarizing pad and a clean planarizing solution includes abrading the titanium nitride layer with the planarizing solution having a pH of approximately 1 to 5.

3. The method of claim 1, wherein abrading the titanium nitride layer with a planarizing surface of a planarizing medium including a fixed-abrasive planarizing pad and a clean planarizing solution includes abrading the titanium nitride layer with the planarizing solution having approximately 1% to 10% by weight of the etchant and approximately 0% to 10% by weight of the buffer.

4. A method of forming an electronic system, comprising:
    providing a processor; and
    coupling a circuit module having a plurality of leads to the processor, the circuit module further having a semiconductor die coupled to at least a portion of the plurality of leads, the semiconductor die including an integrated circuit having a titanium nitride layer, the titanium nitride layer planarized by a method comprising:
        abrading the titanium nitride layer with a planarizing surface of a planarizing medium including a fixed-abrasive planarizing pad and a clean planarizing solution, the planarizing solution having an oxidizer and a buffer, the oxidizer including at least one oxidizing agent selected from the group consisting of ammonium persulfate, ammonium heptamolybdate, ceric ammonium nitrate, ceric ammonium sulfate and hydrogen peroxide.

5. The method of claim 4, wherein abrading the titanium nitride layer with a planarizing surface of a planarizing medium including a fixed-abrasive planarizing pad and a clean planarizing solution includes abrading the titanium nitride layer with the planarizing solution having a pH of approximately 1 to 6.

6. The method of claim 4, wherein abrading the titanium nitride layer with a planarizing surface of a planarizing medium including a fixed-abrasive planarizing pad and a clean planarizing solution includes abrading the titanium nitride layer with the planarizing solution being approximately 1% to 10% by weight of the oxidizer and approximately 0% to 10% by weight of the buffer.

7. The method of claim 1, wherein abrading the titanium nitride layer with a planarizing surface of a planarizing medium including a fixed-abrasive planarizing pad and a clean planarizing solution includes the buffer having at least one buffering agent selected from the group consisting of ammonium acetate, ammonium oxalate, ammonium phosphate and diammonium phosphate.

8. The method of claim 4, wherein abrading the titanium nitride layer with a planarizing surface of a planarizing medium including a fixed-abrasive planarizing pad and a clean planarizing solution includes the buffer having at least one buffering agent selected from the group consisting of phosphoric acid, ammonium acetate, ammonium oxalate, ammonium phosphate and diammonium phosphate.

9. A method of forming an electronic system, comprising:
    providing a processor; and
    coupling a circuit module having a plurality of leads to the processor, the circuit module having a semiconductor die coupled to at least a portion of the plurality of leads, the semiconductor die including an integrated circuit having a titanium nitride layer, the titanium nitride layer planarized by a method comprising:
        abrading the titanium nitride layer with a planarizing surface of a planarizing medium including a fixed-abrasive planarizing pad and a clean planarizing solution, the planarizing solution having an etchant and a buffer, the etchant including an ascorbic acid etching agent.

10. The method of claim 9, wherein abrading the titanium nitride layer with a planarizing surface of a planarizing medium including a fixed-abrasive planarizing pad and a clean planarizing solution includes abrading the titanium nitride layer with the planarizing solution having a pH of approximately 1 to 5.

11. The method of claim 9, wherein abrading the titanium nitride layer with a planarizing surface of a planarizing medium including a fixed-abrasive planarizing pad and a clean planarizing solution includes abrading the titanium nitride layer with the planarizing solution having approximately 1% to 10% by weight of the etchant and approximately 0% to 10% by weight of the buffer.

12. The method of claim 9, wherein abrading the titanium nitride layer with a planarizing surface of a planarizing medium including a fixed-abrasive planarizing pad and a clean planarizing solution includes the buffer having at least one buffering agent selected from the group consisting of ammonium acetate, ammonium oxalate, ammonium phosphate and diammonium phosphate.

13. A method of forming an electronic system, comprising:
providing a processor; and
coupling a circuit module having a plurality of leads to the processor, the circuit module having a semiconductor die coupled to at least a portion of the plurality of leads, the semiconductor die including an integrated circuit having a titanium nitride layer, the titanium nitride layer planarized by a method comprising:
abrading the titanium nitride layer with a planarizing surface of a planarizing medium including a fixed-abrasive planarizing pad and a clean planarizing solution, the planarizing solution having an oxidizer and a buffer, the oxidizer including at least one oxidizing agent selected from the group consisting of ammonium heptamolybdate, ceric ammonium nitrate, and ceric ammonium sulfate.

14. The method of claim 13, wherein abrading the titanium nitride layer with a planarizing surface of a planarizing medium including a fixed-abrasive planarizing pad and a clean planarizing solution includes abrading the titanium nitride layer with the planarizing solution having a pH of approximately 1 to 6.

15. The method of claim 13, wherein abrading the titanium nitride layer with a planarizing surface of a planarizing medium including a fixed-abrasive planarizing pad and a clean planarizing solution includes abrading the titanium nitride layer with the planarizing solution being approximately 1% to 10% by weight of the oxidizer and approximately 0% to 10% by weight of the buffer.

16. The method of claim 13, wherein abrading the titanium nitride layer with a planarizing surface of a planarizing medium including a fixed-abrasive planarizing pad and a clean planarizing solution includes the buffer having at least one buffering agent selected from the group consisting of phosphoric acid, ammonium acetate, ammonium oxalate, ammonium phosphate and diammonium phosphate.

17. A method of forming an electronic system, comprising:
providing a processor; and
coupling a circuit module having a plurality of leads to the processor, the circuit module having a semiconductor die coupled to at least a portion of the plurality of leads, the semiconductor die including an integrated circuit having a titanium nitride layer, the titanium nitride layer planarized by a method comprising:
abrading the titanium nitride layer with a planarizing surface of a planarizing medium including a fixed-abrasive planarizing pad and a clean planarizing solution, the planarizing solution having an etchant and a buffer without substantially including an agent to operate as an oxidizing agent, wherein the etchant includes at least one etching agent selected from the group consisting of oxalic acid, ascorbic acid and phosphoric acid.

18. The method of claim 17, wherein abrading the titanium nitride layer with a planarizing surface of a planarizing medium including a fixed-abrasive planarizing pad and a clean planarizing solution includes the buffer having at least one buffering agent selected from the group consisting of ammonium acetate, ammonium oxalate, ammonium phosphate and diammonium phosphate.

19. The method of claim 17, wherein abrading the titanium nitride layer moving a surface of a surface on which the titanium nitride layer is disposed relative to the planarizing surface of the planarizing medium in a rotational manner.

20. A method of forming an electronic system, comprising:
providing a processor; and
coupling a circuit module having a plurality of leads to the processor, the circuit module having a semiconductor die coupled to at least a portion of the plurality of leads, the semiconductor die including an integrated circuit having a titanium nitride layer, the titanium nitride layer planarized by a method comprising:
abrading the titanium nitride layer with a planarizing surface of a planarizing medium including a fixed-abrasive planarizing pad and a clean planarizing solution, the planarizing solution having an oxidizer and a buffer, wherein the oxidizer includes at least one oxidizing agent selected from the group consisting of ceric ammonium nitrate and ceric ammonium sulfate.

21. The method of claim 20, wherein abrading the titanium nitride layer with a planarizing surface of a planarizing medium including a fixed-abrasive planarizing pad and a clean planarizing solution includes the buffer having at least one buffering agent selected from the group consisting of phosphoric acid, ammonium acetate, ammonium oxalate, ammonium phosphate and diammonium phosphate.

22. The method of claim 20, wherein abrading the titanium nitride layer with a planarizing surface of a planarizing medium including a fixed-abrasive planarizing pad and a clean planarizing solution includes the planarizing solution having a pH of approximately 1 to 6.

* * * * *